(12) United States Patent
Schiwietz et al.

(10) Patent No.: US 7,916,144 B2
(45) Date of Patent: Mar. 29, 2011

(54) HIGH SPEED IMAGE RECONSTRUCTION FOR K-SPACE TRAJECTORY DATA USING GRAPHIC PROCESSING UNIT (GPU)

(75) Inventors: Thomas Schiwietz, Plainsboro, NJ (US); Ti-chiun Chang, Plainsboro, NJ (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 1142 days.

(21) Appl. No.: 11/370,356

(22) Filed: Mar. 8, 2006

(65) Prior Publication Data

US 2007/0014486 A1  Jan. 18, 2007

Related U.S. Application Data

(60) Provisional application No. 60/698,762, filed on Jul. 13, 2005.

(51) Int. Cl.
*G06F 15/00* (2006.01)
*G06T 1/00* (2006.01)
*G09G 5/00* (2006.01)
*G06K 9/00* (2006.01)

(52) U.S. Cl. .......... 345/501; 345/622; 382/131

(58) Field of Classification Search .......... 382/182, 382/280, 131; 600/410; 345/501, 622
See application file for complete search history.

(56) References Cited

U.S. PATENT DOCUMENTS

| | | | |
|---|---|---|---|
| 4,199,660 A * | 4/1980 | Dill et al. | 370/307 |
| 5,089,982 A * | 2/1992 | Gran et al. | 708/401 |
| 5,243,284 A * | 9/1993 | Noll | 324/309 |
| 5,784,042 A * | 7/1998 | Ono et al. | 345/94 |
| 6,018,600 A * | 1/2000 | Levin et al. | 382/284 |
| 6,043,652 A * | 3/2000 | Liu | 324/309 |
| 6,342,885 B1 * | 1/2002 | Knittel et al. | 345/424 |
| 6,373,506 B1 * | 4/2002 | Hosomi | 715/806 |
| 6,429,989 B1 * | 8/2002 | Schultz et al. | 360/51 |
| 6,515,477 B1 * | 2/2003 | Tasaka et al. | 324/309 |
| 6,614,864 B1 * | 9/2003 | Raphaeli et al. | 375/371 |
| 6,664,963 B1 * | 12/2003 | Zatz | 345/426 |
| 6,919,924 B1 * | 7/2005 | Terashita | 348/223.1 |
| 6,943,800 B2 * | 9/2005 | Taylor et al. | 345/543 |
| 7,006,108 B2 * | 2/2006 | Perry et al. | 345/611 |
| 7,126,615 B2 * | 10/2006 | Liao | 345/613 |
| 7,148,685 B2 * | 12/2006 | Block et al. | 324/307 |
| 7,202,663 B2 * | 4/2007 | Huang | 324/307 |
| 7,277,597 B2 * | 10/2007 | Lee et al. | 382/280 |
| 7,436,178 B2 * | 10/2008 | Keupp et al. | 324/318 |
| 7,439,737 B2 * | 10/2008 | Weiss et al. | 324/307 |
| 7,457,655 B2 * | 11/2008 | Welch et al. | 600/407 |
| 7,486,839 B2 * | 2/2009 | Moriguchi et al. | 382/280 |
| 2003/0215154 A1 * | 11/2003 | Pauly et al. | 382/254 |
| 2004/0041563 A1 * | 3/2004 | Lewin et al. | 324/307 |

* cited by examiner

*Primary Examiner* — Kee M Tung
*Assistant Examiner* — Robert Craddock
(74) *Attorney, Agent, or Firm* — Donald B. Paschburg

(57) ABSTRACT

A method for reconstructing an image generated from radial trajectory data in frequency or k-space using a GPU. The method includes using a vertex shader of the GPU to transform coordinates of a window aligned with the radial trajectory data and using a pixel shader of the GPU to combine data along the radial trajectory with the coordinate transformed widow to distribute the data along the radial trajectory fed to the pixel shader into cells of a Cartesian coordinate system.

2 Claims, 7 Drawing Sheets

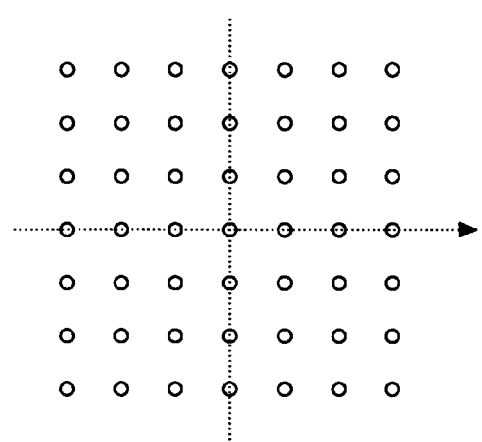
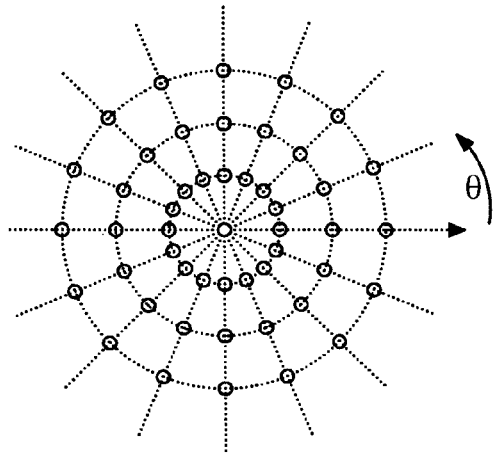
FIG. 2A                          FIG. 2B
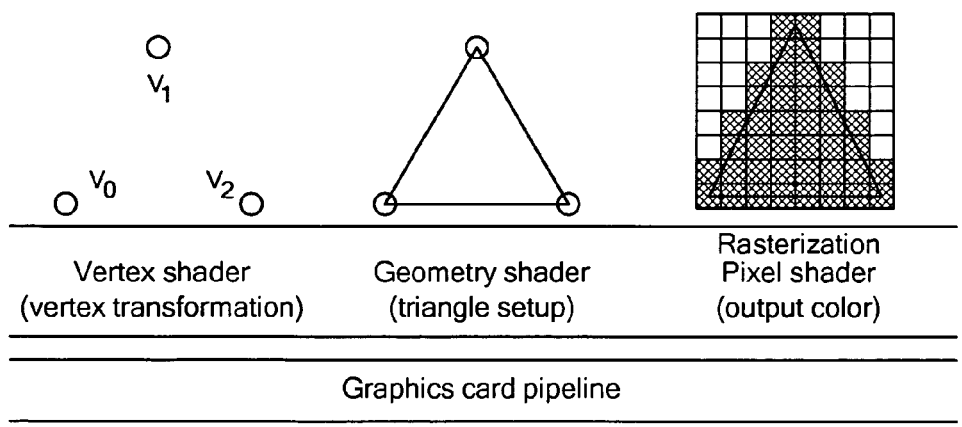
FIG. 3

Filtered Backprojection

HIGH SPEED IMAGE RECONSTRUCTION FOR K-SPACE TRAJECTORY DATA USING GRAPHIC PROCESSING UNIT (GPU)

CROSS REFERENCE TO RELATED APPLICATION

This application claims priority from U.S. Provisional application No. 60/698,762, filed Jul. 13, 2005, which is incorporated herein by reference.

TECHNICAL FIELD

This invention relates generally to Magnetic Resonance (MR) imaging and more particularly to high speed MR imaging.

BACKGROUND

As is known in the art, Magnetic Resonance Imaging (MRI) is based on the physical phenomenon of nuclear magnetic resonance and has been successfully employed in medicine and biophysics for more than 15 years. In this examination modality, the subject is subjected to a strong, constant magnetic field. As a result thereof, the nuclear spins in the subject align, these having been previously irregularly oriented. Radiofrequency energy can then excite these "ordered" spins to a specific oscillation. This oscillation generates the actual measured signal in MRI that is picked up with suitable reception coils. By utilizing non-uniform magnetic fields, which are generated by gradient coils, the test subject can be spatially encoded in all three spatial directions, which is generally referred to as "location encoding".

The acquisition of the data in MRI ensues in k-space (frequency domain). The MRI image or spatial domain is obtained from the MRI data in k-space by means of Fourier transformation. The location encoding of the subject that k-space defines ensues by means of gradients in all three spatial directions. A distinction is made between the slice selection (defines an exposure slice in the subject, usually the Z-axis), the frequency encoding (defines a direction in the slice, usually the x-axis) and the phase encoding (defines the second dimension within the slice, usually the y-axis).

As is also known, fast MR image reconstruction has become more and more important for real-time applications such as interventional imaging. Measurement data from MRI scanners can be nicely interpreted as complex-valued samples in the frequency space, more commonly referred to as k-space in the MR literature. The switching patterns of the magnetic field gradients applied during the measurement determine the sampling trajectories in k-space. Conventional MRI adopts Cartesian trajectories as illustrated in FIG. 2A. When the entire k-space is sampled in this fashion, the image is reconstructed by a straightforward application of the FFT to the measurement data. Other trajectories such as radial, spiral, and Lissajou are possible and generally called non-Cartesian or non-uniform sampling. In this work, we concentrate on the radial trajectories, which is shown in FIG. 2B.

Fast MR image reconstruction has become more and more important for real-time applications such as interventional imaging. An imaging speed of at least 5 frames per second is necessary in order to provide immediate feedback to the physicians. This motivates faster image acquisition and reconstruction.

A popular technique to reconstruct images from non-Cartesian trajectories in k-space is the so-called gridding method, see J. O'Sullivan, "Fast sinc function gridding algorithm for Fourier inversion in computer tomography," IEEE Transaction on Medical Imaging M 1-4(4), pp. 200-207, 1985 and J. I. Jackson, C. H. Meyer, D. G. Nishimura, and A. Macovski, "Selection of a convolution function for Fourier inversion using gridding," IEEE Transaction on Medical Imaging 10(3), pp. 473-478, 1991. The basic idea of gridding is to resample the raw measurement data on the Cartesian grid. Then, the Fast Fourier Transform (FFT) is used to reconstruct the target image.

B. Dale, M. Wendt, and J. L. Duerk proposed a fast implementation which exploits table look-up operations, discuss in a paper entitled "A rapid look-up table method for reconstructing MR images from arbitrary k-space trajectories," IEEE Transaction on Medical Imaging 20(3), pp. 207-217. Given a reasonable window size for interpolation (usually 3×3 or 5×5), this algorithm provides acceptable image quality with high computational efficiency. However, on currently available MR image reconstruction hardware, this algorithm is still a performance bottleneck for real-time imaging applications.

As is also known, graphics processing units (GPUs) provide a powerful subset for parallel single instruction multiple data (SIMD)-type operations which outperform current CPUs even with streaming SIMD extension (SSE) 2 or 3 optimization. Furthermore, there is a second type of parallelism available on modern graphics cards. Today there are 16 to 24 pixel units on board executing SIMD operations in parallel.

S. Thilaka and L. Donald, GPU Gems 2, ch. Medical Image Reconstruction with the FFT, pp. 765-784. Addison-Wesley, describe one variation of GPU FFT implementations and applied it to MR image reconstruction for the case of Cartesian sampling. Interestingly, the GPU implementation of the filtered backprojection algorithm has been more widely investigated in the computed tomography (CT) literature, see F. Xu and K. Mueller, "Accelerating popular tomographic reconstruction algorithms on commodity PC graphics hardware", IEEE Transaction of Nuclear Science, 2005.

Real-time MRI always strives for higher frame rates. MR image acquisition can be sped up further by using multiple receivers and exploiting the differences in their spatial sensitivity profiles to create images from only partially sampled k-space. However, the algorithms for reconstructing these data sets are also quite computational intensive and pose another bottleneck for real-time MR image reconstruction. With existing commercial hardware, either parallel image reconstruction, see S. Müller, M. Bock1, C. Fink, S. Zhlsdorff, P. Speier, and W. Semmler, "truefisp mri with active catheter tracking and real-time parallel image reconstruction," in Proc. Intl. Soc. Mag. Reson. Med, 13th Scientific Meeting & Exhibition, p. 2158, 2005 (GRAPPA (M. A. Griswold and et al., "Generalized autocalibrating partially parallel acquisitions (grappa)," Magnetic Resonance in Medicine 47(6), pp. 1202-1210, 2002) in particular), or gridding can barely be achieved in real-time, but not both together.

Concurrently, using the graphic processing unit (GPU) to improve algorithm performance has become increasingly popular.

There are several publications on calculating the FFT on the GPU. For the CPU-based FFT, the FFTW library (Fastest Fourier Transform in the West, www.fftw.org) is claimed to be the fastest implementation using all possible optimizations like SSE2/3 and hyper threading. Moreland et al. presented in a paper entitled "The FFT on a GPU," in HWWS '03, Proceedings of the ACM SIGGRAPH/EUROGRAPHICS conference on Graphics hardware, pp. 112-119, Eurographics Association, (Aire-la-Ville, Switzerland, Switzerland), 2003, the first GPU implementation with the performance being slower than FFTW. The FFTW library claims to be the fastest implementation of the FFT on the CPU using all kinds of optimizations like SSE2/3 and hyper threading. It is used as the golden standard to compare to GPU implementations.

Schiwietz Thomas and Westermann Ruediger, "GPU-PIV", in proceedings of VMV 2004, pp. 151-158 and Jansen Thomas, von Rymon-Lipinski Bartosz, Hanssen Nils and Keeve Erwin, "Fourier Volume Rendering on the GPU Using a Split-Stream-FFT", in proceedings of VMV 2004, pp. 395-403 presented GPU implementations with the performance being comparable to the FFTW on the CPU.

Sumanaweera Thilaka and Lui Donald, "Medical Image Reconstruction with the FFT", in "GPU Gems 2", Addison-Wesley (2005), pp. 765-784 describe different GPU FFT implementations and its applications in medical image reconstruction. The authors explain MR reconstruction from raw data sampled on a Cartesian grid. While there are not many papers on MR reconstruction using the GPU with radial trajectories, there are many papers about CT reconstruction using the GPU, see Fang Xu and Klaus Mueller, "Accelerating popular tomographic reconstruction algorithms on commodity PC graphics hardware," IEEE Transaction of Nuclear Science, 2005.

As is known in the art, graphics cards provide readable and writable data structures in GPU memory. Basically, there are three types of data structures available: 1D, 2D, and 3D arrays, all referred to as textures. Among them, 2D textures provide the fastest update performance. The array elements of a texture are called texels. Each texel can have up to four float-typed components. The four components are often called the RGBA channels, as they are originally used to represent the red (R), green (G), blue (B), and alpha (A) intensities of a color for rendering.

To set values in a texture, the GPU processing pipeline consisting of several stages is utilized. This procedure is also referred to as "rendering" which is carried over from the original convention when screen pixels are drawn by the pipeline. FIG. 3 illustrates three important stages in the graphics card pipeline, which we elaborate below:

Vertex shader: A stream of vertices enters the vertex shader stage. A vertex is a data structure on the GPU with attributes such as position vectors for certain coordinate systems. In this stage, vertex attributes are manipulated according to the objectives of the applications. Traditionally, user-defined vertex shader programs are used to transform position vectors from one space to another. In one instance of our work, vertices are used to address the k-space coordinates.

Geometry shader (triangle setup): In this stage, sets of three vertices are selected to setup triangles according to a predefined GPU state. These triangles will be used by the next pipeline stage.

Rasterization/Pixel shader: Using the three vertices of each triangle defined above as knot points, this rasterization stage bilinearly interpolates all vertex attributes for the texels circumscribed by this triangle. This is done by the hardware and is highly computational efficient.

Additional information of GPU programming is provided in: J. D. Foley, A. van Dam, S. K. Feiner, and J. F. Hughes, Computer graphics (2nd ed. in C): principles and practice, Addison-Wesley Longman Publishing Co., Inc., Boston, Mass., USA, 1996; M. Woo, Davis, and M. B. Sheridan, OpenGL Programming Guide: The Official Guide to Learning OpenGL, Version 1.2, Addison-Wesley Longman Publishing Co., Inc., Boston, Mass., USA, 1999; K. Gray, Microsoft DirectX 9 Programmable Graphics Pipeline, Microsoft Press, Redmond, Wash., USA, 2003; Information about GPGPU programming. http://www.gpgpu.org; and S. Thilaka and L. Donald, GPU Gems 2, ch. Medical Image Reconstruction with the FFT, pp. 765-784. Addison-Wesley, 2005 all incorporated herein by reference.

SUMMARY

In accordance with the present invention, a method is provided for reconstructing an image generated from radial trajectory data in frequency or k-space using a GPU. The method includes using a vertex shader of the GPU to transform coordinates of a window aligned with the radial trajectory data and using a pixel shader of the GPU to combine data along the radial trajectory with the coordinate transformed widow to distribute the data along the radial trajectory fed to the pixel shader into cells in a Cartesian coordinate system.

In accordance with one feature of the invention the GPU is used to reconstruct an image generated from radial trajectory data in frequency or k-space, such as obtained from MRI equipment, for example. A window, for example an (N×3) rectangle, is sequentially established about each radial trajectory. The corners of the window are defined by vertices. The angle θ of the radial line is fed to the vertex shader of the GPU along with the vertices to thereby rotate the coordinates of the vertices so that the window is aligned with the selected radial trajectory.

In the case of gridding, the coordinate rotated window is fed to a pixel shader along with the Fourier coefficients along the selected radial trajectory. Each frequency coefficient of the trajectory, being a complex number, has the real portion processed by one of a pair of the RGBA channels and an imaginary portion processed by a second one of a pair of the RGBA channels. The pixel shader combines the frequency coefficients along the radial trajectory, for example three of the frequency coefficients closest (e.g., neighboring) to a cell in a Cartesian coordinate system after appropriate weighting, by for example Kaiser-Bessel factors which are stored in a table, to produce a frequency coefficient in such neighboring cell of the Cartesian coordinate system. The coefficients in the cells of the Cartesian coordinate system are fed to an inverse FFT to thereby produce the resulting reconstructed image.

In the case of filtered backprojection, the frequency coefficients along a radial trajectory are first filtered and then fed to an inverse FFT to provide projection data corresponding to the radial trajectory. The data is complex and a pair of the RGBA channels is used for such complex data. These projection data are fed to a pixel shader along with the window, now rotated by the vertex shader, thereby coordinate transforming and interpolating the projection data into a Cartesian coordinate system and therefore into the resulting reconstructed image.

The details of one or more embodiments of the invention are set forth in the accompanying drawings and the description below. Other features, objects, and advantages of the invention will be apparent from the description and drawings, and from the claims.

DESCRIPTION OF DRAWINGS

FIGS. 2A and 2B show Cartesian and radial sampling trajectories, respectively, in k-space;

FIG. 3 shows a graphics card pipeline with the three most important stages: the vertex shader, the geometry shader and the rasterizer/pixel shader of a GPU;

Like reference symbols in the various drawings indicate like elements.

DETAILED DESCRIPTION

Figure 1:
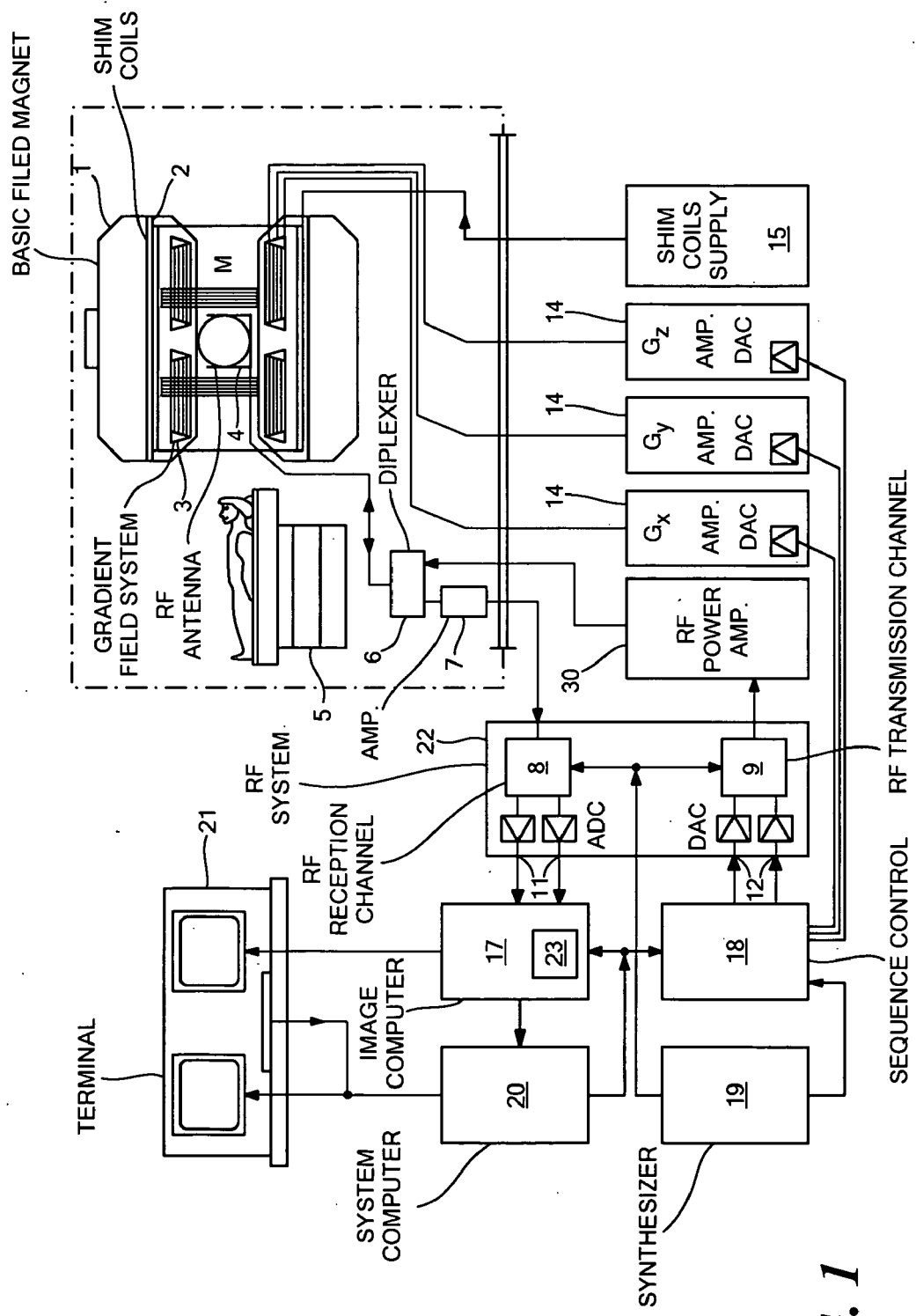
FIG. 1 is a schematically shows a magnetic resonance tomography apparatus operable in accordance with the invention.

Referring now to FIG. 1 a schematic illustration of a magnetic resonance tomography apparatus for generating gradient pulses is shown. The structure of the magnetic resonance tomography apparatus corresponds to the structure of a conventional tomography apparatus, with the differences described below. A basic field magnet 1 generates a temporally constant, strong magnetic field for the polarization or alignment of the nuclear spins in the examination region of a subject such as, for example, a part of a human body to be examined that is disposed on a patient support 5. The high homogeneity of the basic magnetic field required for the magnetic resonance measurement is defined in a spherical measurement volume M into which the parts of the human body to be examined are introduced. For satisfying the homogeneity requirements and, in particular, for eliminating time-invariable influences, shim plates of ferromagnetic material are attached at suitable locations. Time-variable influences are eliminated by shim coils 2 that are driven by a shim power supply 15.

A cylindrical gradient coil system 3 that is composed of three sub-windings is introduced into the basic field magnet 1. Each sub-winding is supplied with current by an amplifier 14 for generating a linear gradient field in the respective direction of the Cartesian coordinate system. The first sub-winding of the gradient field system generates a gradient $G_x$ in the x-direction, the second sub-winding generates a gradient $G_y$ in the y-direction and the third sub-winding generates a gradient $G_z$ in the x-direction. Each amplifier 14 has a digital-to-analog converter DAC that is driven by a sequence controller 18 for the temporally correct generation of gradient pulses.

A radiofrequency antenna 4 is situated within the gradient field system 3. This antenna 4 converts the radiofrequency pulse output by a radiofrequency power amplifier 30 into a magnetic alternating field for exciting the nuclei and alignment of the nuclear spins of the examination subject or of the region of the subject to be examined. The radiofrequency antenna 4 and the gradient coil system 3 are operated in a pulse sequence composed of one or more radiofrequency pulses and one or more gradient pulses. The radiofrequency antenna 4 converts the alternating field emanating from the precessing nuclear spins, i.e. the nuclear spin echo signals, into a voltage that is supplied via an amplifier 7 to a radiofrequency reception channel 8 of a radiofrequency system 22. The radiofrequency system 22 also has a transmission channel 9 in which the radiofrequency pulses for exciting the nuclear magnetic resonance are generated. The respective radiofrequency pulses are digitally represented as a sequence of complex numbers in the sequence controller 18 on the basis of a pulse sequence prescribed by the system computer 20. As a real part and an imaginary part, this number sequence is supplied via an input 12 to a digital-to-analog converter in the radiofrequency system 22 and from the latter to a transmission channel 9. In the transmission channel 9, the pulse sequences are modulated onto a high-frequency carrier signal having a base frequency corresponding to the resonant frequency of the nuclear spins in the measurement volume.

The switching from transmission mode to reception mode ensues via a transmission-reception diplexer 6. The radiofrequency antenna 4 emits the radiofrequency pulses for exciting the nuclear spins into the measurement volume M and samples resulting echo signals. The correspondingly acquired nuclear magnetic resonance signals are phase-sensitively demodulated in the reception channel 8 of the radiofrequency system 22 and converted via respective analog-to-digital ADC converters into a real part and an imaginary part of the measured signal, which are available at outputs 11 of the radiofrequency system 22. An image computer 17 reconstructs an image from the measured data acquired in this way. The management of the measured data, of the image data and of the control programs ensues via the system computer 20. On the basis of control programs, the sequence controller 18 controls the generation of the desired pulse sequences and the corresponding sampling of k-space. In particular, the sequence controller 18 controls the temporally correct switching of the gradients, the emission of the radiofrequency pulses with defined phase and amplitude as well as the reception of the magnetic resonance signals. The time base (clock) for the radiofrequency system 22 and the sequence controller 18 is made available by a synthesizer 19. The selection of corresponding control programs for generating a magnetic resonance image as well as the presentation of the generated magnetic resonance image ensue via a terminal 21 that has a keyboard as well as one or more picture screens. The GPU with vertex and pixel shader units is a hardware chip on a graphics card 23 within image computer 17.

The present invention is directed to a method for reconstructing an image generated from radial trajectory data in frequency or k-space using a GPU. A vertex shader of the GPU is used to transform coordinates of a window aligned with the radial trajectory data and a pixel shader of the GPU is used to combine data along the radial trajectory with the coordinate transformed widow to distribute the data along the radial trajectory fed to the pixel shader into cells in a Cartesian coordinate system.

More particularly, the GPU is used to reconstruct an image generated from radial trajectory data in frequency or k-space, such as obtained from MRI equipment, for example. A window, for example an (N×3) rectangle, is sequentially established about each radial trajectory. The corners of the window are defined by vertices. The angle θ of the radial line is fed to the vertex shader of the GPU along with the vertices to thereby rotate the coordinates of the vertices so that the window is aligned with the selected radial trajectory.

In the case of gridding, the coordinate rotated window is fed to a pixel shader along with the Fourier coefficients along the selected radial trajectory. Each frequency coefficient of the trajectory, being a complex number, has the real portion processed by one of a pair of the RGBA channels and an imaginary portion processed by a second one of a pair of the RGBA channels. The pixel shader combines the frequency coefficients along the radial trajectory, for example three of the frequency coefficients closest (e.g., neighboring) to a cell in an Cartesian coordinate system after appropriate weighting, by for example Kaiser-Bessel factors which are stored in a table, to produce a frequency coefficient in such neighboring cell of the Cartesian coordinate system. The coefficients in the cells of the Cartesian coordinate system are fed to an inverse FFT to thereby produce the resulting reconstructed image.

In the case of filtered backprojection, the frequency coefficients along a radial trajectory are first filtered and then fed to an inverse FFT to provide projection data corresponding to the radial trajectory. The data is complex and a pair of the RGBA channels is used for such complex data. These projection data is fed to a pixel shader along with the window, now rotated by the vertex shader, thereby coordinate transforming and interpolating the projection data into a Cartesian coordinate system and therefore into the resulting reconstructed image.

Gridding Reconstruction

The Gridding Algorithm

Figure 4A:
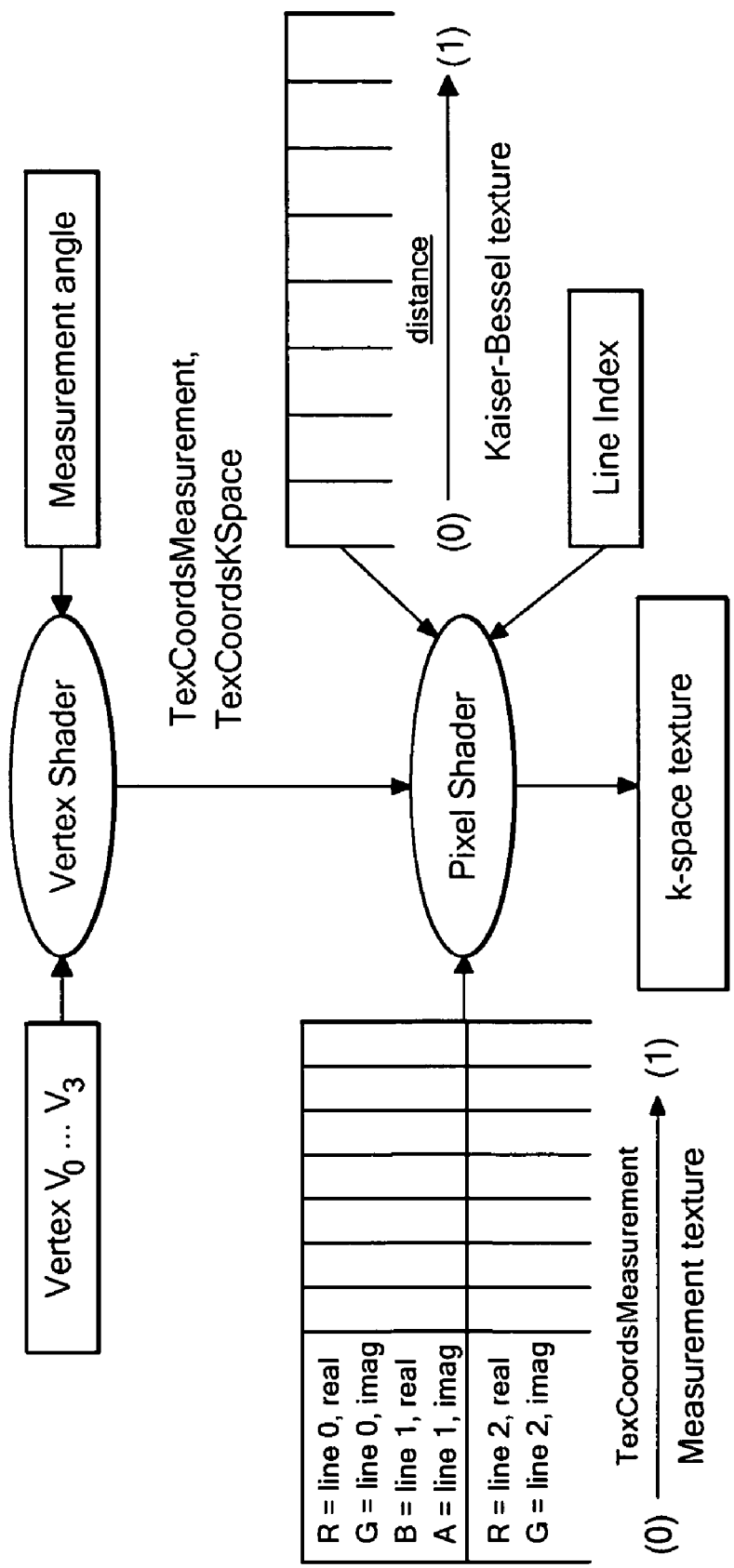
FIG. 4A is a diagram showing a GPU gridding process according to the invention.
Figure 4B:
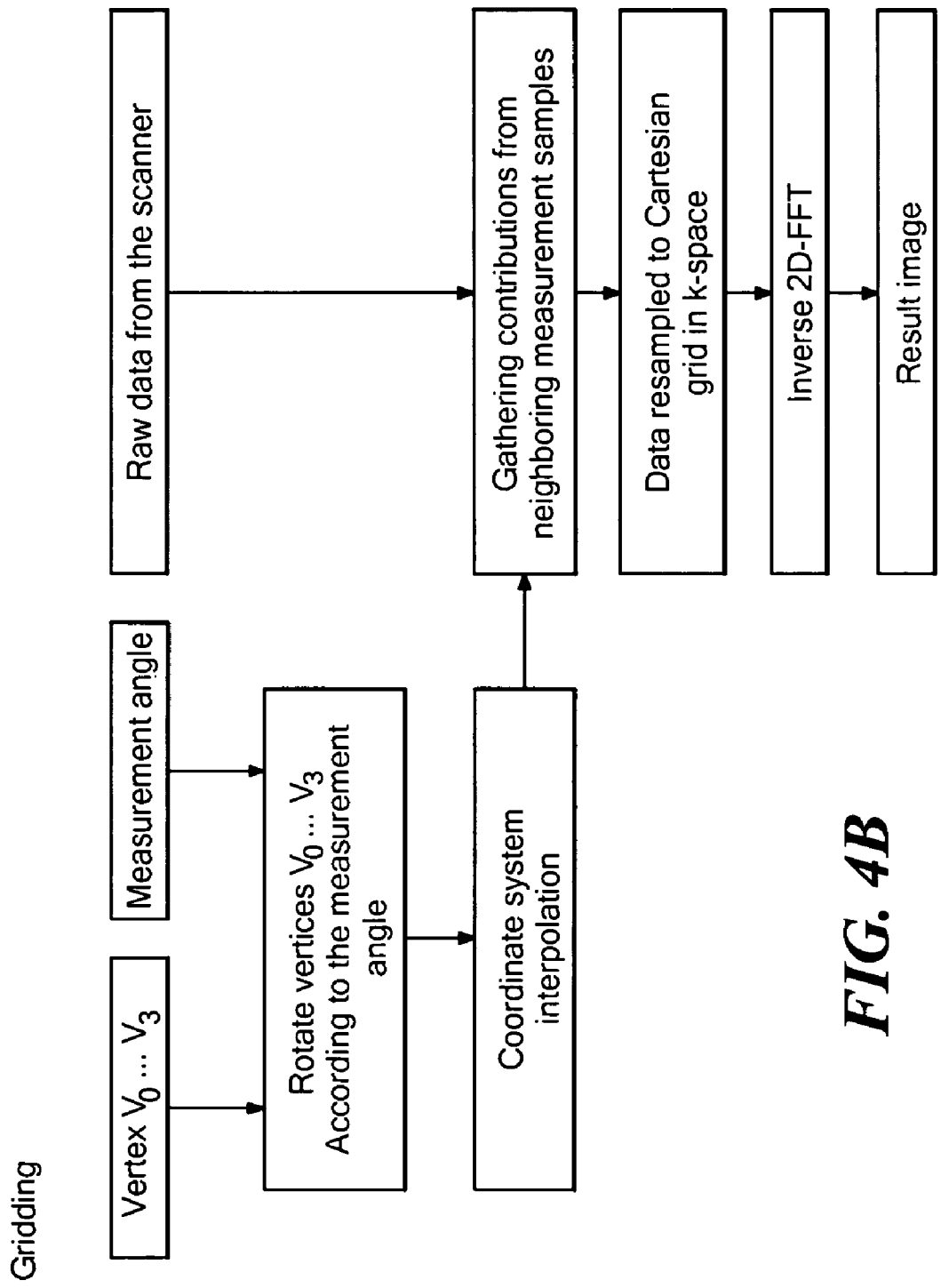
FIG. 4B is a flow diagram of the gridding process according to the invention
Figure 5A:
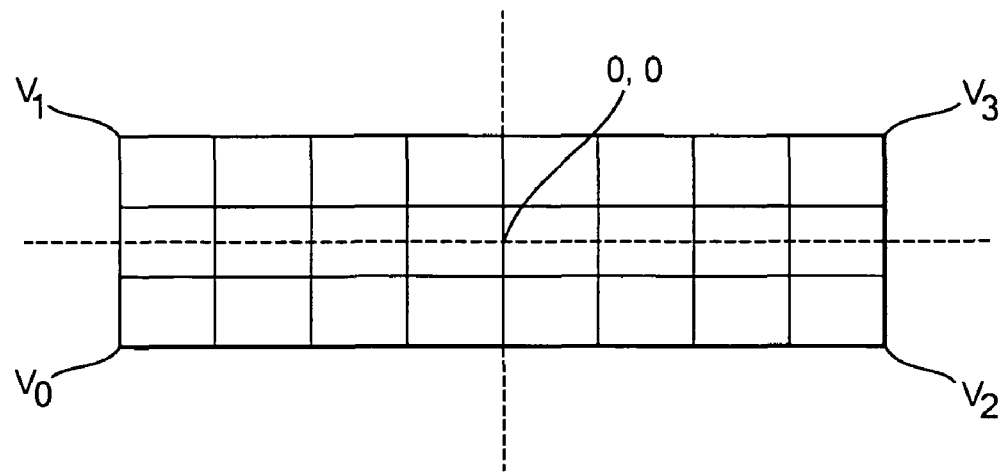
FIG. 5A shows an N×3 pixels quadrilateral defined by the vertices v0 . . . v3 and used in the GPU gridding process according to the invention.

Referring to FIGS. 4A and 4B, the process of gridding reconstruction using a GPU is shown. Initially the GPU programmer establishes a window, here a rectangle, having vertices $v_0$-$v_3$ as shown in FIG. 5A. The rectangle is here an N×3 rectangle, where N is the number of Fourier coefficients, represented by dots in FIG. 5B, along a radial trajectory shown in FIG. 5B. Here the vertices $v_0$-$v_3$ are at 0, −1.5, 0, +1.5, N, −1.5, and N, +1.5, respectively. For each radial trajectory shown in FIG. 3B, the vertex shader of a GPU rotates the vertices in accordance with the measurement angle, θ, shown in FIGS. 2B and 5B.

Figure 5B:
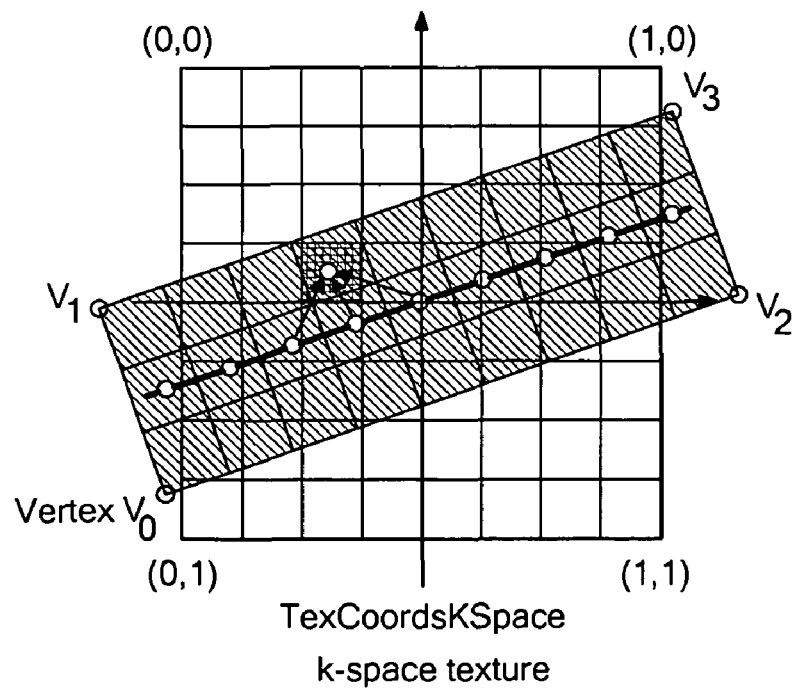
FIG. 5B shows the N×3 pixels quadrilateral defined by the vertices v0 . . . v3 of FIG. 5A rotated by the vertex shader of the GPU according to the measurement angle, θ.

Raw data from the MR scanner, i.e., the Fourier coefficients in k-space shown in FIG. 5B is fed to the pixel shader of the GPU. Two coordinate systems are defined: one addressing k-space (TexCoordsKSpace), the other addressing the measurement data (TexCoordsMeasurement). The pixel shader performs a grid-driven interpolation from the three nearest measurement samples with weights computed according to the density compensation function and the distance.

More particularly, each measurement point on a radial trajectory, i.e., Fourier coefficient, is assigned to the closest Cartesian grid cell in the 2D frequency domain. With a slight increase in computational effort the image quality can be improved by distributing each measurement sample to a small neighborhood around the closest Cartesian grid cell with the weighting determined by a Kaiser-Bessel window. Ideally, a convolution with a sinc function had to be used, but this is impractical due to its infinity support.

The GPU implementation creates a 4-channel 2D floating-point texture which will be used to record the gridded samples. For each measurement line, the window is rotated according to the measurement angle θ of the radial trajectory, sometimes referred to as a line, and rendered onto the target for gridding. Here, N is the number of samples, here Fourier coefficients, per line. The Kaiser-Bessel weights are precomputed and stored in another texture, which is looked up in the gridding shader. The results are blended to the frequency domain if graphics hardware allows. If not, the summation has to be programmed explicitly by the shader.

A different approach is Cartesian grid-driven interpolation. For each Cartesian point the contributions from all available measurement points is computed. The number of contributing measurement points can vary very much and so is the weighting for each point. Here, the process stores the most significant weightings and measurement locations per Cartesian grid cell in a texture—for example the top 4 that is closest to the Cartesian point in question. This fits well on the GPU because the interpolation can be done in a single rendering pass and therefore is very fast. The gridding shader looks up the precomputed lookup texture to fetch the locations and weights of the most significant measurement samples and sums them up.

With the completion of gridding operation, the process uses the 2D FFT to transform the frequency domain texture to obtain the final reconstructed image.

More particularly, as described by B. Dale, M. Wendt, and J. L. Duerk, "A rapid look-up table method for reconstructing MR images from arbitrary k-space trajectories," IEEE Transaction on Medical Imaging 20(3), pp. 207-217, 2001, the table-based Kaiser-Bessel window gridding algorithm distributes each measurement sample on a radial line to a small area (3×3) around the nearest cell on the Cartesian grid. Contrarily, our GPU implementation gathers surrounding measurement samples for each Cartesian grid cell since distribution operations are not supported by the current generation of GPUs.

As noted above, the all GPU textures are float-typed. The measurement data is stored in the measurement texture. All measurement lines are stacked up into the 2D texture. Each measurement sample is complex-valued, therefore two channels are required to stored the signal. In order to increase memory efficiency, even-numbered measurement lines are stored in the RG channels and odd ones are stored in the BG channels, as shown in FIG. 4B. The gridded results in the Cartesian k-space is represented in the k-space texture. Again, two channels are required to store this complex-valued signal. The remaining two channels can be used to represent another set of the gridded results. This is useful when there are several measurement channels as two sets of data can be reconstructed in parallel.

The process maps the radial measurement line with a thickness of three pixels to the Cartesian grid. This is illustrated by the skewed rectangular shaped box on the right hand side of FIG. 4. Then, for each covered Cartesian grid cell ($k_x$, $k_y$), the process computes the contribution $c_i(k_x, k_y)$ from the three nearest measurement samples $m_i(k_x, k_y)$ located at $N_i(k_x, k_y)$, where i=0, 1, 2. This procedure is exemplified by the grid cell CELL in FIG. 5B and explained below.

The density compensation factor $\rho(D_{Ni}(k_x, k_y))$, which is inversely proportional to the distance $D_{Ni}(k_x, k_y)$ between $N_i(k_x, k_y)$ and the k-space origin, is multiplied with $m_i(k_x, k_y)$.

Then, the process uses the distance $d_{mi}(k_x, k_y)$ between $N_i(k_x, k_y)$ and ($k_x, k_y$) to look up the precomputed Kaiser-Bessel table and obtain the weighting coefficient $w(d_{mi}(k_x, k_y))$ so that we have $$c_i(k_x,k_y)=w(d_{mi}(k_x,k_y))\cdot\rho(D_{Ni}(k_x,k_y))\cdot m_i(k_x,k_y). \quad (1)$$

Here, Kaiser-Bessel is stored in a lookup table in a 1D texture (Kaiser-Bessel texture) as it is computationally inefficient to evaluate the Kaiser-Bessel function on the fly. This table is precomputed at program initialization. Furthermore, the process provides the measurement and k-space texture as input data to the shader program. As the measurement data is stacked up in a 2D texture, a line index parameter is passed as a constant to the shader program in order to index a specific measurement line in the stack.

A quadrilateral, here the rectangular window covering N×3 pixels, is rotated by a vertex shader program according to the measurement angle θ in order to rasterize the correct Cartesian grid cells in k-space. Two coordinate systems are required in the pixel shader later. One coordinate system addresses the Cartesian grid of k-space, called the TexCoordsKSpace. The other coordinate system addresses along the radial measurement line, called the TexCoordsMeasurement. Both coordinate systems are fixed at each vertex as attributes and interpolated in each Cartesian cell bi-linearly.

The gridding is performed in the pixel shader program of the GPU. The pixel shader gets the interpolated coordinates TexCoordsMeasurement and TexCoordsKSpace. Using TexCoordsMeasurement, the pixel shader computes $D_{Ni}(k_x, k_y)$ and thus $\rho(D_{Ni}(k_x, k_y))$ for each Cartesian grid cell. Next, $N_i(k_x, k_y)$ is evaluated and $d_{mi}(k_x, k_y)$ is calculated. The distance $d_{mi}(k_x, k_y)$ is used to index the Kaiser-Bessel texture to retrieve $w(d_{mi}(k_x, k_y))$. Finally, the measurement sample $m_i(k_x, k_y)$ indexed by TexCoordsMeasurement is weighted to obtained $c_i(k_x, k_y)$ as defined in Eq. (1). This procedure is repeated for i=0, 1, and 2. Using the coordinate system TexCoordsKSpace, these $c_i(k_x, k_y)$ are accumulated into the k-space texture from different quadrilaterals that encompass $(k_x, k_y)$. The overall contributions that a Cartesian grid cell $(k_x, k_y)$ receives are $$C(k_x, k_y) = \sum_{v \in R(k_x, k_y)} \sum_{i=0}^{2} c_i^v(k_x, k_y) \quad (2)$$

where $R(k_x, k_y)$ denotes the collections of radials lines that contain neighboring measurement samples of $(k_x, k_y)$; and $c_i^v(k_x, k_y)$ is the ith contribution from the vth radial line. We note that since the blending operation is not supported for 32-bit floating by the current generation of graphics hardware, this step must be programmed explicitly.

After all measurement lines have been gridded, the process uses an FFT implementation to transform the gridded samples to obtain an image. Finally, the deapodization is applied to the image. The process pre-computes the deapodization coefficients on a CPU and store them into a texture. Then, a pixel-wise multiplication of the image and the deapodization texture is performed on the GPU to render the final image.

Filtered Backprojection Reconstruction Overview

The transformation of each measurement line to the projection domain (known as the sinogram) by 1D-FFT potentates for back projection as known from tomographic reconstruction. According to the inverse Radon transform, a high pass filter is applied before the transformation to compensate for the nonuniform sampling density and to enhance the edges. The filtering is a rendering pass where the texture coordinates represent the frequencies. According to the frequencies one of the following filter types is computed: ramp, Ram-Lak, Shepp-Logan or a Hamming-Filter.

The filtered data in projection domain is back projected by rendering rotated quads for each measurement line to an accumulation texture. The back projection shader rotates either vertex positions or texture positions according to the measurement angle, fetches one measurement line for the entire quad and writes it to the accumulation output texture. Again, the blending to accumulate the back projections can be done by the GPU blending units if available, or explicitly by a shader program.

According to the central slice theorem, a line passing through the k-space origin can be inversely Fourier transformed to obtain projection data in the image domain with the projection angle perpendicular to the k-space line. When the projection data is arranged in 2D with the angle being one axis and the projection position being the other, they are called a sinogram $s(\phi, x)$. Each radial line in our measurement data can be considered as the projection data $s(\phi_k, x)$ with a fixed angle $\phi_k$. Therefore, filtered backprojection algorithms can also be used to reconstruct our MR images. Basically, each element in the sinogram $s(\phi, x)$ is a line integral of a given 2D signal along the angle $\phi$ at position x of the projection. This process is known as the Radon transform. Filtered backprojection, which consists of the following main steps, is a direct method to reconstruct the 2D signal.

1. High-pass/band-pass filtering: According to the derivation of the inverse Radon transform, a high-pass filter has to be applied to projection data. Several commonly used filters are Ram-Lak, Shepp-Logan, or Hamming filter. In our work, we simply use the frequency response of the Ram-Lak filter to multiply with each radial line in our measurement data. This procedure is exactly the same as the density compensation in our gridding implementation.
2. FFT: As the above filtering operation is performed directly in k-space, we then use 1D FFT to transform the filtered results to the projection data in the spatial domain.
3. Backprojection: Finally, the projection data with angle $\phi$ is backprojected onto the image domain. In this step, interpolation is necessary to obtain desirable values on the Cartesian grid. In our work, this is automatically done by the GPU using bilinear interpolation.

GPU Implementation

Figure 6A:
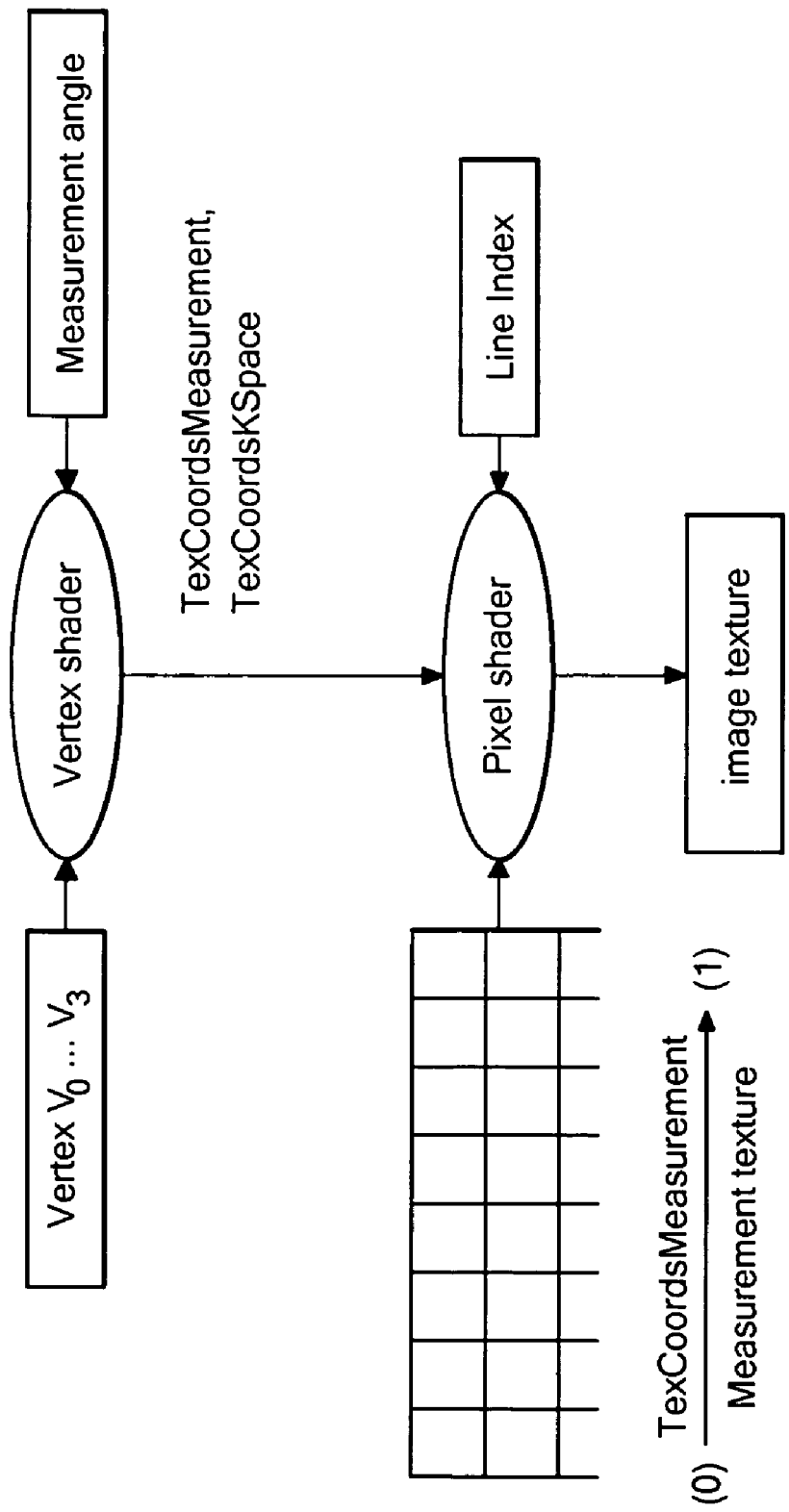
FIG. 6A is a diagram showing a GPU filtered backprojection process according to the invention.
Figure 6B:
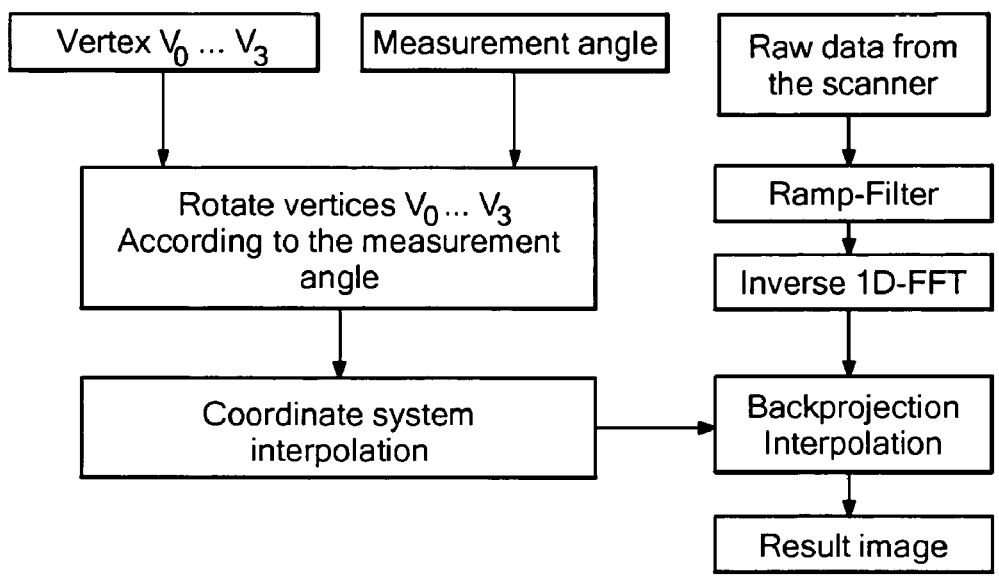
FIG. 6B is a flow diagram of the GPU filtered backprojection process according to the invention.

Referring to FIGS. 6A and 6B, a flow diagram of the process for backprojection reconstruction is shown. The process includes High-pass/band-pass filtering each line of k-space data. Here, the filtering is done in the frequency domain by appropriate weighting of the k-space samples. A Ram-Lak filter is stored in a 1D floating point texture, called the filter texture, whose length is equal to that of a measurement line. A pixel shader program of the GPU multiplies the measurement texture by the filter texture line by line.

1. FFT: The k-space measurement data is transformed to the spatial domain by the GPU-FFT implementation described above. The high-pass filtering and the transformation to the spatial domain is done for all available measurement lines at the same time, as the measurement lines are stacked up in a single 2D texture.

Figure 7:
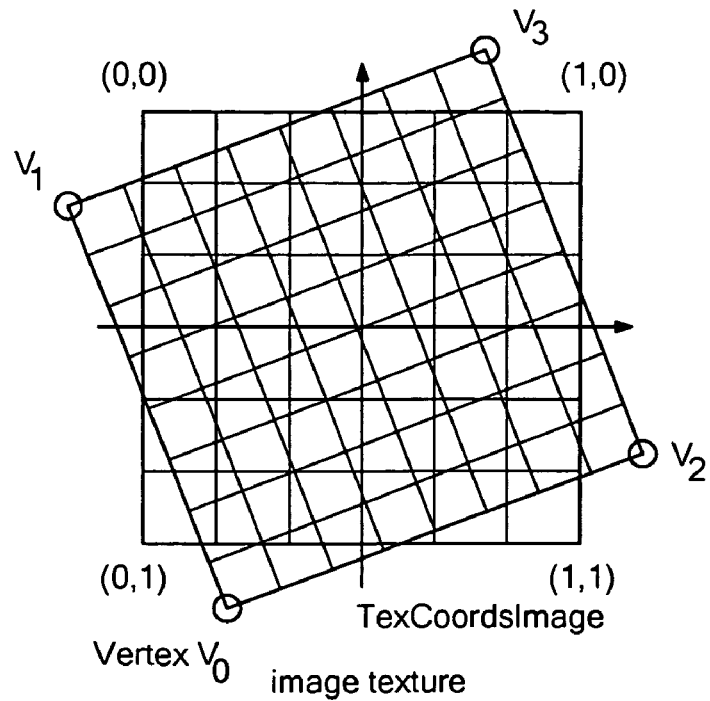
FIG. 7 shows a quadrilateral covering the image domain is rotated by a vertex shader program according to the measurement angle.

Backprojection: Referring to FIG. 7 the backprojection implementation on the GPU is shown. Four vertices $v_0 \ldots v_3$ setup a quadrilateral covering N×N pixels. The quadrilateral is rotated according to the measurement angle θ by the vertex shader program. Two coordinate systems are defined: one addressing k-space (TexCoordsKSpace), the other addressing the measurement data (TexCoordsMeasurement). The pixel shader samples the measurement data at the interpolated TexCoordsMeasurement position and writes it to the interpolated TexCoordsKSpace position. The measurement line is repeated over the entire quadrilateral. Thus, similar to the gridding implementation, two coordinate systems are required. The coordinate system TexCoordsImage addresses the image domain (image texture) for the accumulation of the previous backprojections. The other coordinate system TexCoordsMeasurement addresses k-space samples in the measurement texture. The backprojection (i.e., background interpolation in FIG. 6B) is executed in a pixel shader program of the GPU. The sinogram $s(\phi_k, x)$ corresponds to the measurement texture where $\phi_k$ is the line index and x is the TexCoordsMeasurement. One measurement line is reused inside the rotated quadrilateral to achieve the backprojection. This procedure is repeated for each measurement line. Similar to the implementation of the gridding algorithm, the backprojection results have to be accumulated. Using TexCoordsImage, the previous backprojected and accumulated values can be accessed and accumulated. Future generations of GPUs will provide a floating-point blending operator for this purpose. This approach is easy to implement and very GPU friendly. No look-up tables or dependent textures fetches are required.

A number of embodiments of the invention have been described. Nevertheless, it will be understood that various modifications may be made without departing from the spirit and scope of the invention. For example, while described for MRI the process may be used with other types of tomography such as CT with "parallel beam" projections, especially the filtered backprojection method. Accordingly, other embodiments are within the scope of the following claims.

What is claimed is:

1. A method for reconstructing an image generated from radial trajectory data in frequency or k-space using a graphic processing unit (GPU), comprising:
   sequentially establishing a window about each radial trajectory, corners of the window being defined by vertices;
   feeding an angle θ of the radial line relative to a reference to a vertex shader of the GPU along with the vertices to thereby rotate the coordinates of the vertices to align the window is aligned with the selected radial trajectory;
   feeding the coordinate rotated window to a pixel shader of the GPU along with the Fourier coefficients along the selected radial trajectory, each frequency coefficient of the trajectory, being a complex number, having the real portion processed by one of a pair of Red, Green, Blue, Alpha (RGBA) channels of the GPU and an imaginary portion processed by a second one of a pair of the RGBA channels;
   combining in the pixel shader the frequency coefficients along the radial trajectory, a plurality of the frequency coefficients closest to a cell in an Cartesian coordinate system after appropriate weighting to produce a frequency coefficient in such neighboring cell of the Cartesian coordinate system;
   feeding the coefficients in the cells of the Cartesian coordinate system to an inverse FFT to thereby produce the resulting reconstructed image.

2. A method for reconstructing an image generated from radial trajectory data in frequency or k-space using a graphic processing unit (GPU), comprising:
   weighting the frequency coefficients along a radial trajectory;
   feeding the weighted frequency components to an inverse FFT to provide projection data corresponding to the radial trajectory;
   sequentially establishing a window about each radial trajectory, corners of the window being defined by vertices;
   feeding an angle θ of the radial line relative to a reference to a vertex shader of the GPU along with the vertices to thereby rotate the coordinates of the vertices to align the window is aligned with the selected radial trajectory;
   feeding the projection data corresponding to each radial trajectory to a pixel shader of the GPU along with the window, now rotated by the vertex shader, to coordinate transform and interpolate the projection data into a Cartesian coordinate system and therefore into the resulting reconstructed image.

* * * * *